(12) United States Patent
Wang et al.

(10) Patent No.: US 12,543,259 B2
(45) Date of Patent: Feb. 3, 2026

(54) RADIO-FREQUENCY CIRCUIT FOR PHASED ARRAY ANTENNA

(71) Applicant: TRON FUTURE TECH INC., Hsinchu (TW)

(72) Inventors: Chien Cheng Wang, Hsinchu (TW); Li Han Chang, Hsinchu (TW); Yu-Jiu Wang, Hsinchu (TW); Ta-Shun Chu, Hsinchu (TW)

(73) Assignee: TRON FUTURE TECH INC., Hsinchu (TW)

( * ) Notice: Subject to any disclaimer, the term of this patent is extended or adjusted under 35 U.S.C. 154(b) by 577 days.

(21) Appl. No.: 18/065,934

(22) Filed: Dec. 14, 2022

(65) Prior Publication Data

US 2023/0422394 A1 Dec. 28, 2023

Related U.S. Application Data

(60) Provisional application No. 63/367,030, filed on Jun. 24, 2022.

(51) Int. Cl.
*H05K 1/02* (2006.01)
*H01P 3/08* (2006.01)
*H04B 7/06* (2006.01)

(52) U.S. Cl.
CPC ............. *H05K 1/0243* (2013.01); *H01P 3/08* (2013.01); *H04B 7/0613* (2013.01); *H05K 2201/0108* (2013.01); *H05K 2201/10098* (2013.01)

(58) Field of Classification Search
CPC .. H01P 1/184; H01P 1/18; H01P 1/181; H01P 1/182; H01P 3/081; H05K 1/0239; H05K 1/0243; H05K 1/0268; H05K 1/117; H05K 2201/09245; H05K 2201/09263; H05K 2201/09272

(Continued)

(56) References Cited

U.S. PATENT DOCUMENTS 10,181,943 B2    1/2019    Frye et al.
11,018,436 B2    5/2021    Mahanfar et al.

(Continued)

FOREIGN PATENT DOCUMENTS

JP    1997-237867 A    9/1997
JP    2000-223926    8/2000

(Continued)

OTHER PUBLICATIONS

English abstract translation of JP2000-223926 and WO2000045464A1.

(Continued)

*Primary Examiner* — Ajibola A Akinyemi
(74) *Attorney, Agent, or Firm* — WPAT, P.C.; Anthony King

(57) ABSTRACT

A wireless communication system includes a plurality of antennas, and a plurality of RF chips, arranged in a row and coupled to the antennas, for providing a plurality radio-frequency (RF) output signals to the antennas according to an RF signal. The wireless communication system also includes a transmission line arranged to be a straight line in parallel to the row, and to connect to the RF chips, and a resistive load, coupled to a first end of the transmission line. A second end of the transmission line is arranged to receive the RF signal.

20 Claims, 12 Drawing Sheets

(58) Field of Classification Search
USPC .......................................................... 455/101
See application file for complete search history.

(56) References Cited

U.S. PATENT DOCUMENTS

| | | | |
|---|---|---|---|
| 11,171,623 | B2 | 11/2021 | Chayet et al. |
| 11,888,240 | B2 | 1/2024 | Takaki et al. |
| 2005/0206603 | A1* | 9/2005 | Kawachi .................. G09G 3/20 345/98 |
| 2008/0315914 | A1 | 12/2008 | Nam et al. |
| 2012/0169430 | A1* | 7/2012 | Wang ........................ H01P 5/10 333/26 |
| 2021/0021031 | A1 | 1/2021 | Wyler |
| 2021/0126366 | A1 | 4/2021 | Sudo et al. |
| 2021/0234257 | A1* | 7/2021 | Rofougaran ........... H01Q 21/24 |
| 2021/0359415 | A1 | 11/2021 | Takaki et al. |
| 2022/0060164 | A1 | 2/2022 | Chayat et al. |
| 2023/0045955 | A1 | 2/2023 | Hasegawa et al. |

FOREIGN PATENT DOCUMENTS

| | | | |
|---|---|---|---|
| JP | 2013058887 | A | 3/2013 |
| JP | 2019-535182 | A | 12/2019 |
| JP | 2021016154 | A | 2/2021 |
| JP | 2021-114753 | A | 8/2021 |
| JP | 2022-505108 | A | 1/2022 |
| TW | 200910763 | A | 3/2009 |
| TW | 201937808 | A | 9/2019 |
| WO | WO2000045464 | A1 | 8/2000 |
| WO | 2020027058 | A1 | 2/2020 |
| WO | 2020-158810 | A1 | 8/2020 |

OTHER PUBLICATIONS

Office Actions of a Korean counterpart application No. 10-2023-0074060 issued by the Korean IPO on May 23, 2024.
English abstract translation of office actions of a Korean counterpart application No. 10-2023-0074060 issued by the Korean IPO on May 23, 2024.
Taiwan counterpart application No. 11114808 issued by the Taiwan IPO on Jun. 13, 2024.
English abstract translation of Taiwan counterpart application No. 11114808 issued by the Taiwan IPO on Jun. 13, 2024.
U.S. Pat. No. 20080315914A1 is translation for TW200910763A.
Notice of Allowance issued Oct. 29, 2024 by Japan IPO, with translation.
First Office Action and search report issued Dec. 28, 2023 by Taiwan IPO with translation.
U.S. Appl. No. 11/018,436 is the US counterpart of TW201937808.
First Office Action and search report issued Jun. 25, 2024 by Japan IPO.
English translation of the First Office Action and search report issued Jun. 25, 2024 by Japan IPO.
U.S. Pat. No. 11,171,623 serves as a translation for JP2022-505108.
US patent publication 20230045955 serves as a translation for JP2021-114753.
U.S. Pat. No. 11,888,240 serves as a translation for WO2020-158810.
English translation of JP-1997-237867A.
U.S. Pat. No. 10,181,943 serves as a translation for JP2019-535182.

* cited by examiner

RADIO-FREQUENCY CIRCUIT FOR PHASED ARRAY ANTENNA

PRIORITY CLAIM AND CROSS-REFERENCE

This application claims priority to U.S. provisional application Ser. No. 63/367,030 filed Jun. 24, 2022, the disclosure of which is hereby incorporated by reference in its entirety.

BACKGROUND

In modern wireless communication technologies, the phased array antenna technique has attracted a lot of attention due to its advantages such as higher gain, higher reliability, and beam steering capability as compared to conventional antenna technologies. The phased array antenna technology adopts an array of antennas arranged with well-managed antenna spacing, and thus the substrate area on which the array antennas are deployed would be much larger than the conventional non-array antennas. The substrate planarity is one of the important issues for developing a large-scale antenna array with acceptable cost. On the other hand, the radio-frequency (RF) circuit with higher circuit density and less power consumption is required to achieve better signal processing performance for the antenna array. Therefore, there is a need to develop a new architecture of the phased array antenna to resolve the issue of the substrate, on which the RF circuits and the antennas can be formed with low cost and high performance.

SUMMARY

Embodiments of the present disclosure proposes a wireless communication system, including a plurality of antennas, and a plurality of RF chips arranged in a row and coupled to the antennas for providing a plurality radio-frequency (RF) output signals to the antennas according to an RF signal. The wireless communication system also includes a transmission line arranged to be a straight line in parallel to the row, and to connect to the RF chips, and a resistive load, coupled to a first end of the transmission line. A second end of the transmission line is arranged to receive the RF signal.

According to embodiments of the present disclosure, a wireless communication system includes: a plurality of antennas; a plurality of RF chips, arranged in a row and coupled to the antennas, for receiving a plurality radio-frequency (RF) signals from the antennas to output a plurality of RF output signals; a transmission line, arranged to be a straight line in parallel to the row, and to connect to the RF chips for receiving the RF output signals; and a resistive load, coupled to a first end of the transmission line. S second end of the transmission line is arranged to output an accumulated RF output signal of the RF output signals.

Through the arrangement of the proposed phased array antenna and RF chips, the transmitter and the receiver can be manufactured with less cost, and operated with less power. The device reliability can also be improved.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
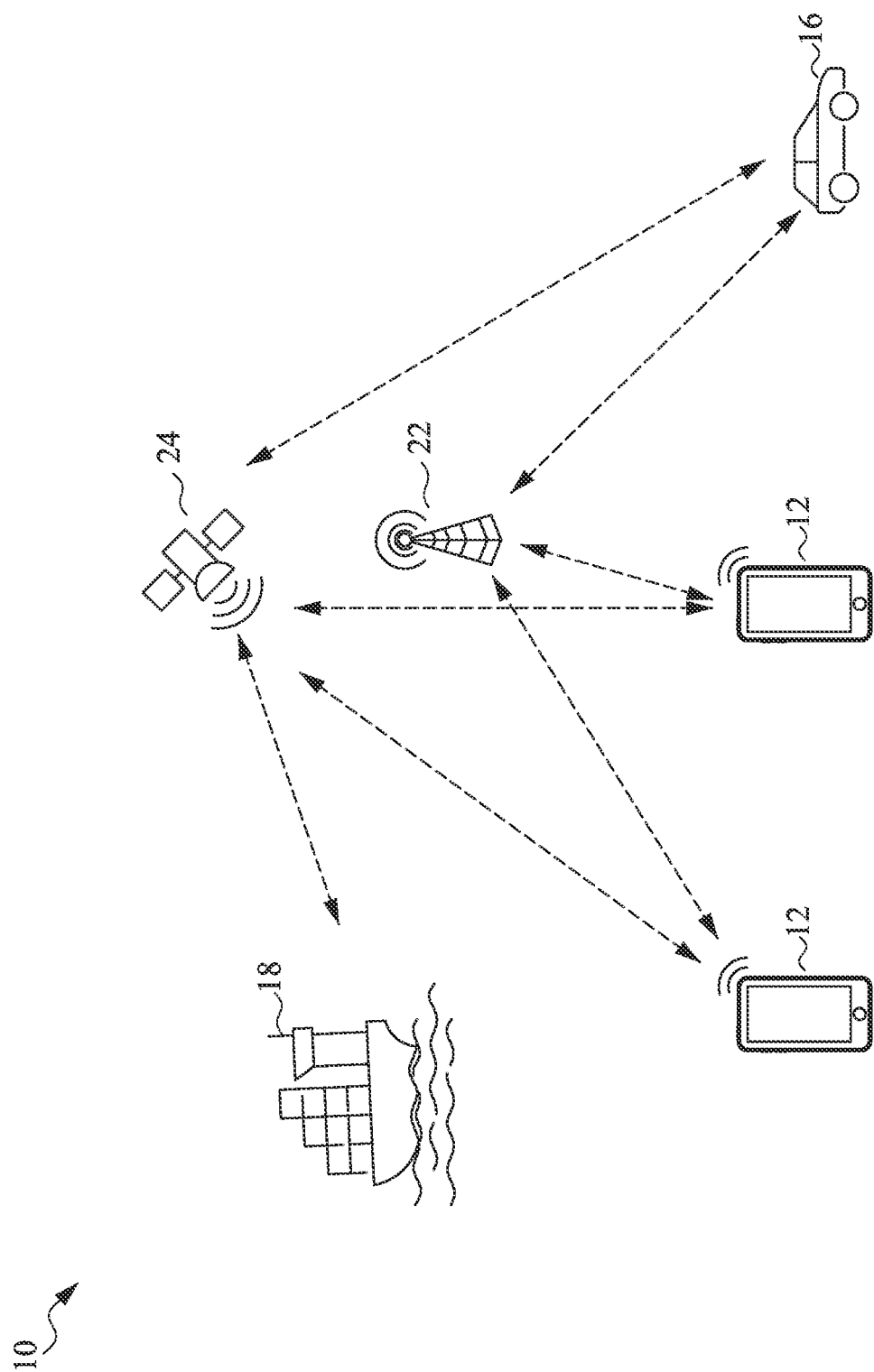
FIG. 1 is a schematic diagram showing a wireless communication system in a next-generation communication scenario, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As used herein, the term "connected" may be construed as "electrically connected," and the term "coupled" may also be construed as "electrically coupled." "Connected" and "coupled" may also be used to indicate that two or more elements cooperate or interact with each other.

FIG. 1 is a schematic diagram showing a wireless communication system 10 in a next-generation communication scenario, in accordance with some embodiments of the present disclosure. The wireless communication system 10 includes one or more user devices 12, 14, 16 and 18, a terrestrial base station 22 and a non-terrestrial base station 24. In some embodiments, the user devices 12, 14 is carried and moved by a human, and are referred to as hand-held devices. In some embodiments, the user device 16 is a mobile device equipped in a vehicle moving on the land, such as a car, a train, or the like. In some embodiments, the user device 18 is a user device equipped in a ship moving in the sea, a river, or the like.

In some embodiments, the terrestrial base station 22 is an example of a base station deployed in a communication network, such as cellular communication network. The terrestrial base station 22 is configured to provide a communication network to the user devices 12, 14 and 16, in which the user devices 12, 14 and 16 can transmit or receive information between one another through the network established by a plurality of the terrestrial base stations 22. The terrestrial base station 22 may also be referred to as low altitude platform. In some embodiments, the non-terrestrial based station 24 is an example of a communication satellite deployed in a communication satellite network. The non-terrestrial base station 24 is configured to provide a communication network to the user devices 12, 14, 16 and 18, in which the user devices 12, 14, 16 and 18 can transmit or receive information between one another via the satellite network. A plurality of the terrestrial base stations 22 and a plurality of the non-terrestrial base stations 24 can interlink to form a unified communication network, in which a global communication network can be realized to cover the user devices all over the world no matter where they are located, either in a low-altitude location, in a high-altitude location, or in any place not covered by the terrestrial base stations 22.

To achieve the goal of the global communication network exemplified by the wireless communication system 10, the user device 12, 14, 16 or 18 may need redesign to include a transmitter or a receiver with greater communication capability to communicate with the non-terrestrial base station 24 located in the high sky. Among the various transmitter or receiver designs, the phased array antenna technology is a promising solution to realize the beamforming technique, which can significantly increase the transmitter or receiving gain with greater reliability, and is suitable for satellite communication.

Figure 2A:
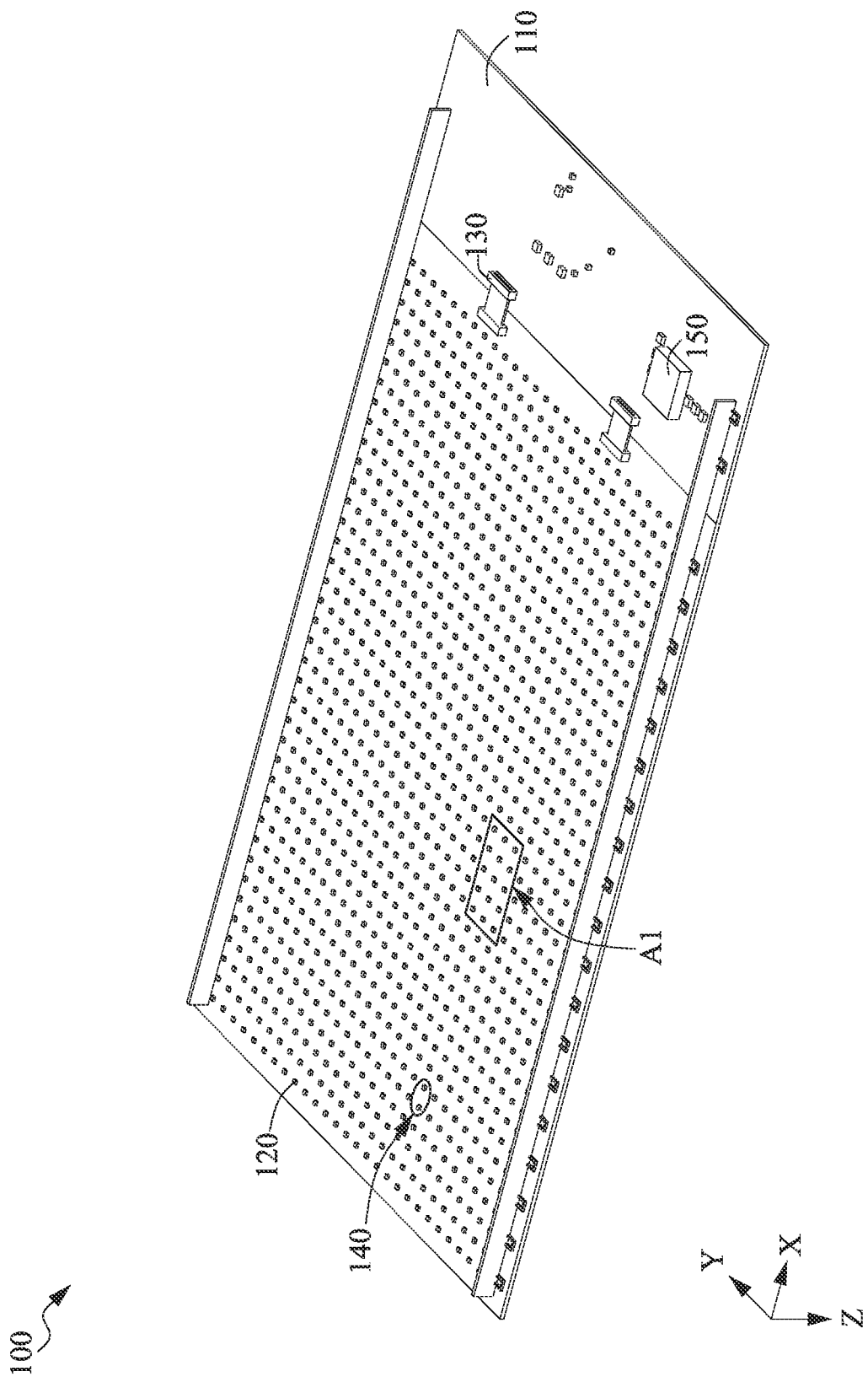
FIG. 2A is a schematic perspective view of a transmitter or receiver of a user device, in accordance with some embodiments.

FIG. 2A is a schematic perspective view of a transmitter 100 of the user device 12, 14, 16 or 18 shown in FIG. 1, in accordance with some embodiments. In some embodiments, the transmitter 100 is an RF transmitter. In some embodiments, the transmitter 100 includes a control circuit board 110, an RF circuit board 120, and a connection circuit board 130 electrically connecting the RF circuit board 120 to the control circuit board 110. Further, the RF circuit board 120 includes an antenna array formed of an array of antenna elements 140, such as antenna patches, formed on the substrate of the RF circuit board 120. In some embodiments, the transmitter 100 is applicable to the terrestrial base station 22 or the non-terrestrial base station 24.

In some embodiments, the control circuit board 110 is a printed circuit board (PCB) and includes a substrate on which a plurality of circuit chips and routing are formed. In some embodiments, the control circuit board 110 includes one or more semiconductor dies, for example, a semiconductor die 150 mounted on the surface of the control circuit board 110. The substrate of the control circuit board 110 may be formed of epoxy resin with metal (e.g., copper) foils. The control circuit board 110 is configured to generate control signals and data signals, and provide the same to the RF circuit board 120 through the connection circuit board 130. The data signals may be baseband signals or intermediate-frequency (IF) signals modulated by a modulation carrier of a predetermined frequency, e.g., 455 kHz. IF. In some embodiments, the control circuit board 110 is configured to convert a first voltage potential to a second voltage potential and transmit suitable supply voltages to the RF circuit board 120. In some embodiment, the connection circuit board 130 includes a flexible or inflexible substrate and includes a plurality of transmission lines configured to transmit the supply voltage, the control signals and IF data signals to the RF circuit board 120.

In some embodiments, the user devices 12, 14, 16 and 18 also have a receiver (not separately shown) to function together with the transmitter 100 to accomplish two-way communications. The configuration of the transmitter 100 shown in FIG. 2A can also be applied to a receiver 101 (see FIG. 4A), which also has a control circuit board 111, an RF circuit board 121 and a connection circuit board 130 interconnected in a manner similar to the transmitter 100. The user devices 12, 14, 16 and 18 may include both of the transmitter 100 and the receiver 101 to form a wireless communication system. The differences between the transmitter 100 and the receiver 101 will be explained later.

Figure 2B:
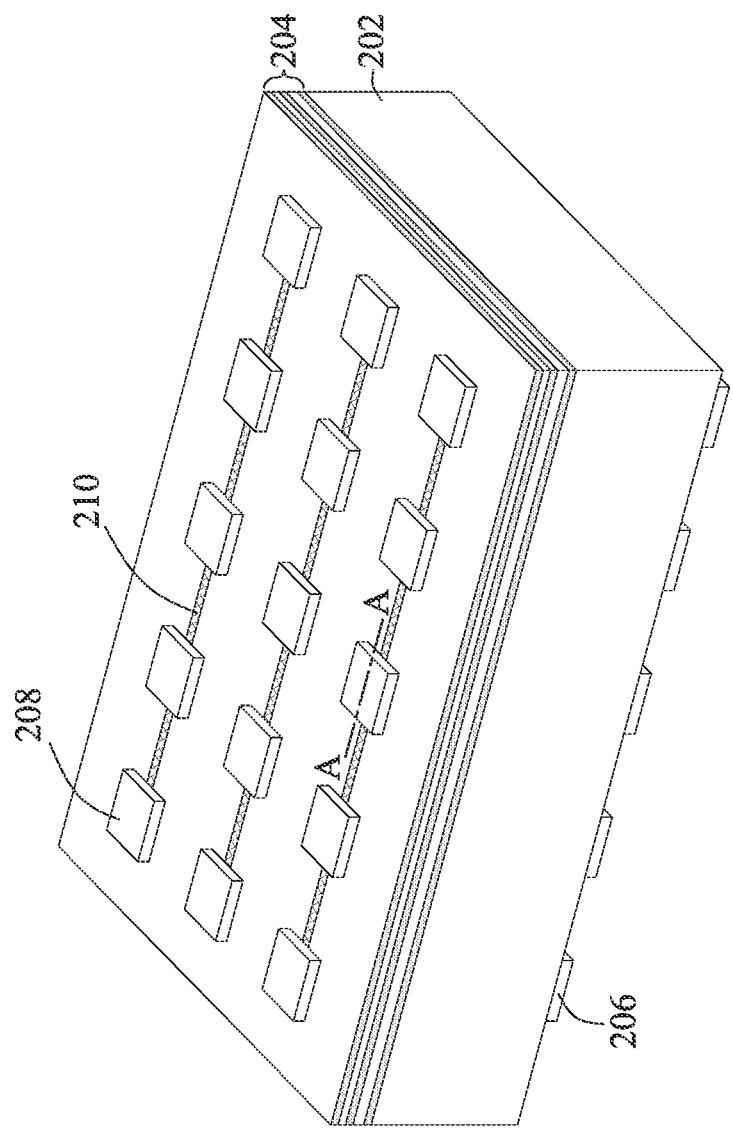
FIG. 2B is an enlarged view of a portion of the transmitter or receiver shown in FIG. 2A, in accordance with some embodiments.

FIG. 2B is an enlarged view of a portion A1 of the RF circuit board 120 shown in FIG. 2A, in accordance with some embodiments. Please be noted that the vertical direction (positive Z-axis) of the RF circuit board 120 shown in FIG. 2B is reversed with respect to FIG. 2A. In some embodiments, the RF circuit board 120 includes a substrate 202 and an interconnect structure 204 arranged over the substrate 202. The interconnect structure 204 has an upper surface, and the substrate 202 has a lower surface. In some embodiments, an array of antenna elements 206 are formed on the lower surface of the substrate 202, while a plurality of RF chips 208 are arranged on the upper surface of the interconnect structure 204. The RF chips 208 may be interconnected through a plurality of conductive lines 210. In some embodiments, the conductive lines 210 may be encapsulated by an electrical insulating material or exposed through the surface of the interconnect structure 204. In some embodiments, the array of antennas of the transmitter 100 includes a patch antenna structure, and the antenna element 206 is the antenna patch of the respective antenna structure.

Figure 2C:
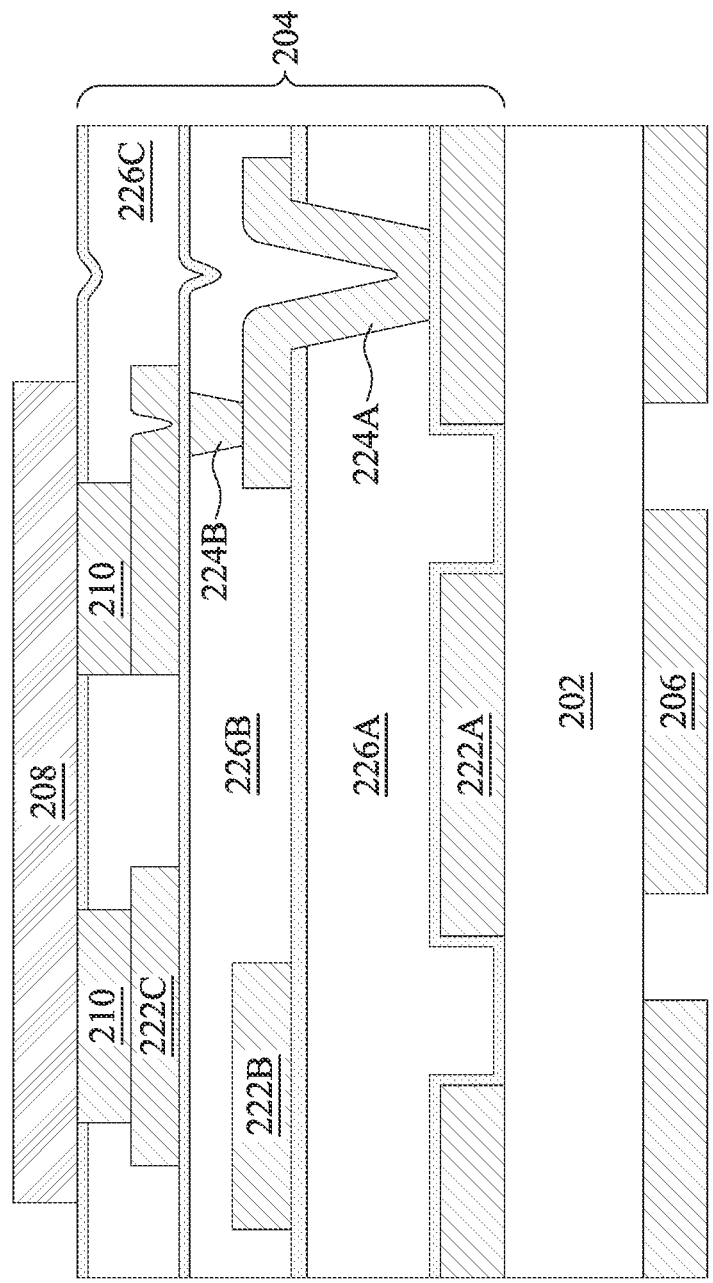
FIG. 2C is a schematic cross-sectional view of the transmitter or receiver shown in FIG. 2B, in accordance with some embodiments.

FIG. 2C is a schematic cross-sectional view of the RF circuit board 120 shown in FIG. 2B, in accordance with some embodiments. The schematic cross-sectional view shown in FIG. 2C is taken from a sectional line AA in FIG. 2B. Referring to FIG. 2C, the substrate 202 is formed of a transparent material, such as glass, fused silica, silicon oxide, quartz, or the like. In some embodiments, the substrate 202 separates the antennas element 206 from the electronic circuits of the interconnect structure 204 or RF chips 208. In some embodiments, RF signals are transmitted from the RF chip 208 formed on the upper side of the substrate 202, through the RF circuit formed in the interconnect structure 204, radiated across the transparent substrate 202, and coupled to the antenna elements 206 formed on the lower side of the substrate 202. In some embodiments, the thickness of the substrate 202 is determined based on the working frequency of the antenna elements 206. Since the material of the substrate 202 is transparent to the RF signals, the substrate 202 may be free of any conductive members to connect the interconnect structure 204 to the antenna elements 206.

In some embodiments, the interconnect structure 204 is formed of a plurality of metallization layers in a stack. The metallization layers include patterned conductive lines or conductive vias, and these patterned conductive lines and vias are patterned or electrically interconnected to form interconnection paths and other parts of the antennas. For example, a first metallization layer formed on the substrate 202 includes first conductive lines or pads 222A. The first conductive lines or pads 222A may be used as ground plates, and the remaining spaces may be formed as apertures for coupling RF signals to the antenna elements 206. A second metallization layer is formed over the first metallization layer and includes first conductive vias, including the example first conductive via 224A. Likewise, a third metallization layer is formed over the second metallization layer and includes second conductive lines or pads 222B, and a fourth metallization layer is formed over the third metallization layer and includes a plurality of second conductive vias, including the example second conductive via 224B. The second conductive lines may be patterned to form power lines or signal transmission lines. A fifth metallization layer is formed over the fourth metallization layer and includes third conductive lines 222C. The third conductive lines 222C may be patterned to form transmission lines for communicating the RF signals or the control signals between the RF chips 208. In some embodiments, the conductive lines 222A, 222B, 222C are interconnected through the conductive vias 224A and 224B. In some embodiments, a plurality of conductive lines 210 are arranged over the sixth metallization layer and electrically connecting the conductive lines 222C to the RF chips 208.

In some embodiments, the conductive lines 222A, 222B, 222C and 210 and the conductive vias 224A and 224B are formed of conductive materials, such as copper, tungsten, aluminum, titanium, tantalum, alloys thereof, or the like. The conductive lines 222A, 222B, 222C and the conductive vias 224A and 224B are further electric ally insulated by an insulating material 226A, 226B or 226C, such as a polymer-based material, e.g., polyimide or epoxy resin.

Figure 3A:
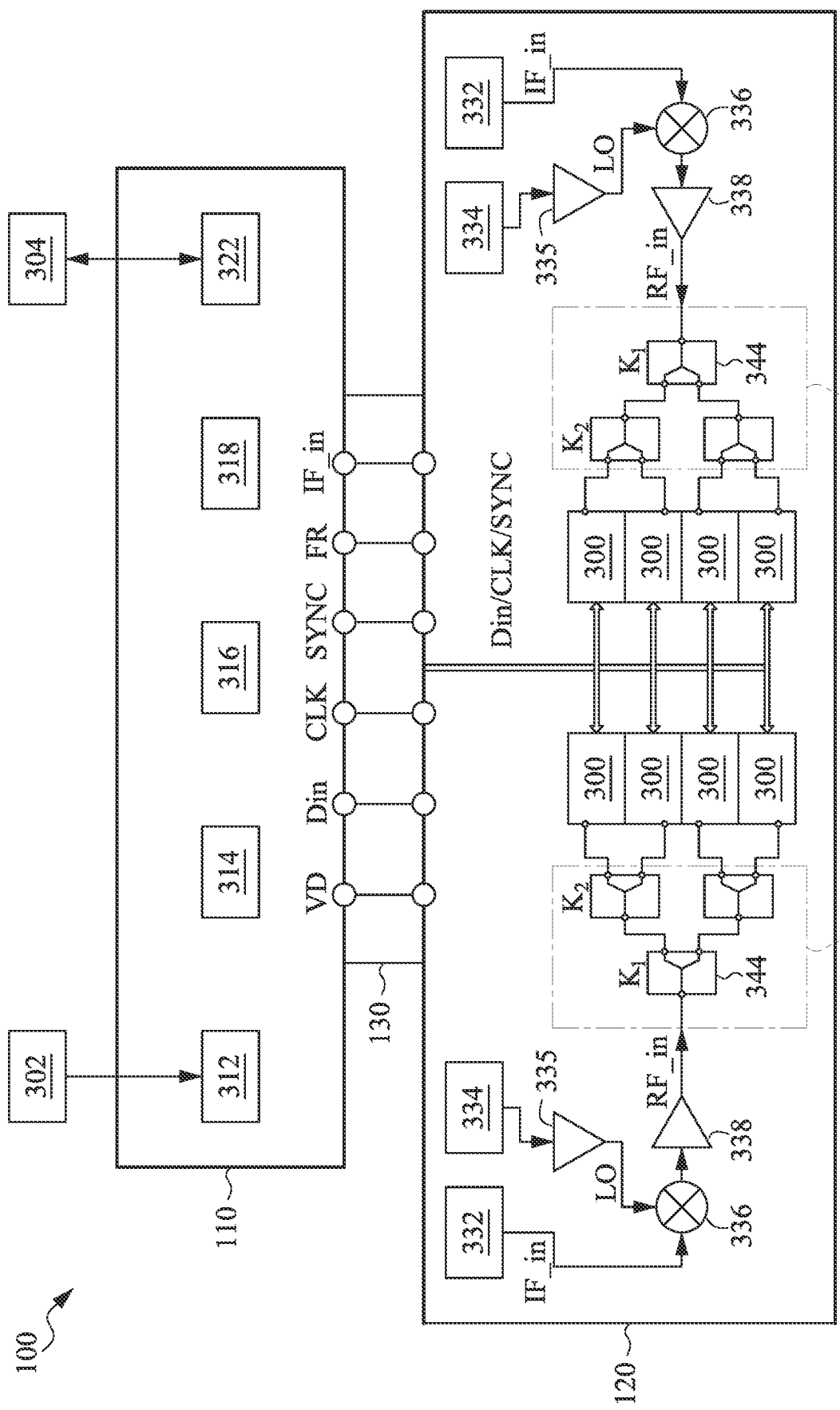
FIG. 3A is a schematic block diagram of a transmitter, in accordance with some embodiments.

FIG. 3A is a schematic block diagram of the transmitter 100 shown in FIG. 2A, in accordance with some embodiments. Referring to FIG. 2A and FIG. 3A, in some embodiments, the control circuit board 110 includes a power conversion module 312, a memory module 314, a controller 316, a local oscillator module 318 and a data processing module 322. The control circuit board 110 is configured to provide a supply voltage VD, an IF data signals IF_in, a reference frequency signal LO, and control signals (including calibration data Din, a data clock signal CLK, and a synchronization clock signal SYNC) to the RF circuit board 120 through the input/output ports on two sides of the connection circuit board 130 and signal lines in the connection circuit board 130.

In some embodiments, the power conversion module 312 is configured to receive an input power from a supply voltage source 302 external to the control circuit board 110. The power conversion module 312 may include a voltage converter configured to convert an initial supply voltage, e.g., 110 volts, of the supply voltage source 302 to a supply voltage VD, e.g., 5 volts or 1.2 volts for the components of the RF circuit board 120. The power conversion module 312 may further supply power to other components of the control circuit board 110, such as the memory module 314, the controller 316, the local oscillator module 318 and the data processing module 322. In some embodiments, the power conversion module 312 includes a voltage transformer to provide the supply voltage VD. In some embodiments, the power conversion module 312 further includes an electromagnetic interference filter for filtering interference.

In some embodiments, the memory module 314 is configured to store data and command, e.g., the transmission data, accessible by the controller 316 and the data processing module 322. The memory module 314 may include different types of memory, e.g., random-access memory (RAM), read-only memory (ROM), flash memory, cache memory, or the like.

In some embodiments, the controller 316 is configured to generate the IF data signal IF_in by modulating the transmission data by the IF modulation carrier. The transmission data may be provided by the data processing module 322. The IF data signals IF_in will be up-converted to be an RF signal RF_in by the RF circuit board 120.

In some embodiments, the controller 316 is further configured to generate the control signals for calibration of the RF signals, such as calibration data Din, the data clock signal CLK, and the synchronization clock signal SYNC. In some embodiments, the calibration data Din are used to calibrate the amplitude or phase of the RF signals RF_in according to the transmission data or commands. The calibration data may include amplitude calibration data or phase calibration data, or both. In some embodiments, the data clock signal CLK is used to provide a generic clock for the registers in the components of the RF circuit board 120. The frequency of the data clock signal CLK may represent the working frequency of the digital data processing in the RF circuit board 120. In some embodiments, the synchronization clock signal SYNC is used to provide a clock for some of the registers in different stages to output the calibration data at the same clock time. The synchronization clock signal SYNC may represent the update rate of the calibration data. In some embodiments, since the control signals include a digital form, they are also referred to as digital control signals.

The local oscillator module 318 is configured to generate the reference frequency signal FR for up-conversion or down conversion between the IF signals IF_in and the RF signals RF_in. In some embodiments, the local oscillator module 318 includes a crystal oscillator configured to generate the reference frequency signal FR of a predetermined frequency.

In some embodiments, the data processing module 322 is configured to receive input data or commands from a control unit 304 external to the control circuit board 110. The data processing module 322 may also be configured to transmit output data provided by the controller 316. In some embodiments, the data processing module 322 includes a network interface circuit configured to receive or transmit data or commands under a transmission protocol. The data processing module 322 may be configured to extract the transmission data or the control signals from the input data.

In some embodiments, the RF circuit board 120 includes a pair of RF signal generation paths, a pair of power divider networks 342, and two columns of transmitter arrays 300. Each RF signal generation path includes an IF signal receiver 332, a phase-locked loop module 334, amplifiers 335 and 338, and a mixer 336.

Figure 3B:
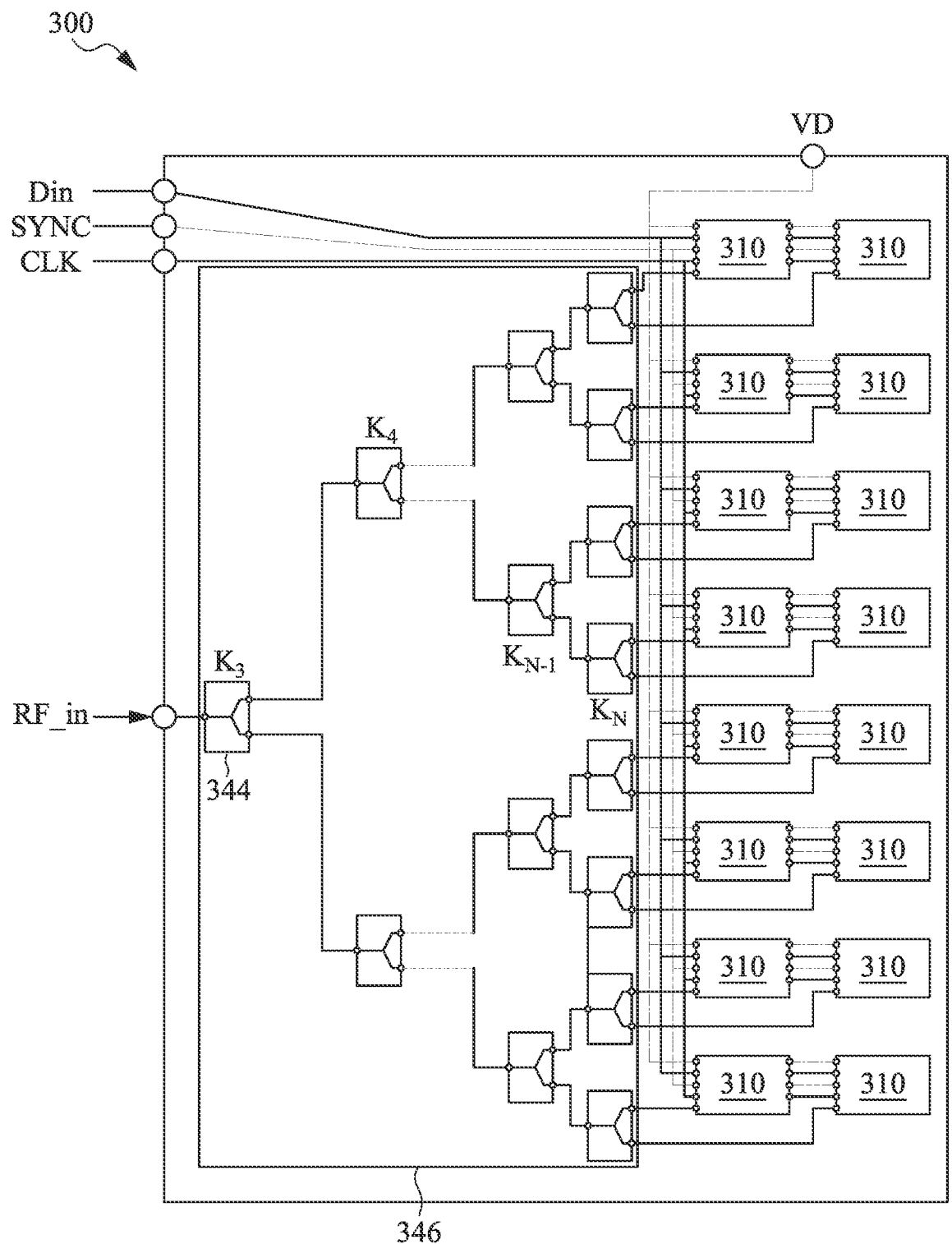
FIG. 3B is a schematic block diagram of a transmitter array of the transmitter shown in FIG. 3A, in accordance with some embodiments.
Figure 3C:
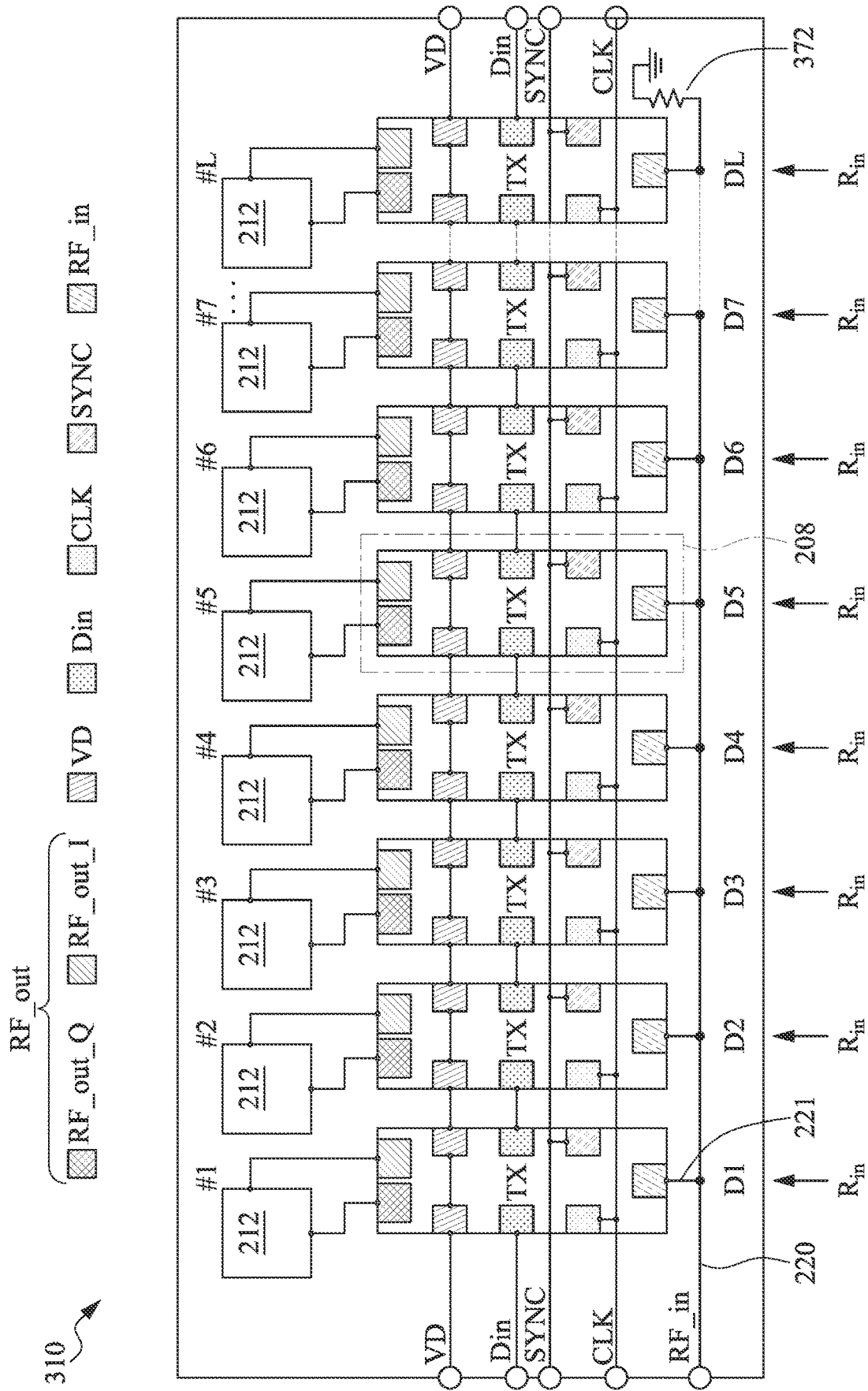
FIG. 3C is a schematic block diagram of a transmitter block of the transmitter array shown in FIG. 3B, in accordance with some embodiments.

In some embodiments, each of the power divider networks 342 is connected to the output of the corresponding mixer 336 and configured to deliver the RF signal RF_in to each RF chip 208 (see FIG. 3C). In some embodiments, the power divider network 342 is a multistage power divider network formed of a plurality of power dividers 344 connected in a tree structure or binary structure. In some embodiments, the power divider network 342 includes two stages $K_1$ and $K_2$, and each power divider 344 in stage $K_1$ or $K_2$ is configured to distribute power of the RF signal RF_in substantially equally to the two outputs of the power divider 344. Each output of the power divider 344 at stage $K_2$ is connected to a corresponding transmitter array 300. In some embodiments, the left-side power divider network 342 and the right-side power divider network 342 are symmetrically arranged about a central line between the left-side and right-side power divider networks 342. In some embodiments, the left-side column of the transmitter arrays 300 and the right-side column of transmitter arrays 300 are symmetrically arranged about a central line between the left-side column and right-side column of the transmitter arrays 300. In some embodiments, the power divider 344 can also be used as a power combiner in a receiver architecture, in which the input terminal and output terminals of the power divider 344 are reversed to the output terminal and the input terminals of the power combiner.

In some embodiments, the control signals, including the calibration data Din, the data clock signal CLK and the synchronization clock signal SYNC, are provided to each of the transmitter arrays 300 through a bus or a plurality of signal lines. In some embodiments, the depicted embodiment only shows a two-stage power divider network 342. However, a power divider network 342 with a stage number greater or less than two can also be applicable to the transmitter 100 in other embodiments. In some embodiments, the depicted embodiment only shows four transmitter arrays 300 in one column of the transmitter arrays 300. However, a number of the transmitter arrays 300 in an array greater or less than four can also be applicable to the transmitter 100 in other embodiments, in which the number of the transmitter arrays 300 is scaled to the stage number of the power divider network 342.

In some embodiments, the IF signal receiver 332 is configured to receive the IF data signals IF_in from the connection circuit board 130. The phase-locked loop module 334 may be configured to generate a local oscillator signal LO based on the reference frequency FR through a phase-locking loop. In some embodiments, the local oscillator signal LO is amplified via the amplifier 335. In some embodiments, the amplifier 335 is an operational amplifier. The mixer 336 is configured to up-convert the IF signals IF_in to the RF signal RF_in at a predetermined operation frequency, e.g., 18 GHz, 28 GHz, or other suitable frequencies. In some embodiments, the RF signal RF_in is amplified via the amplifier 338. In some embodiments, the amplifier 338 is an operational amplifier. In some embodiments, more control signals, such as a phase-locked loop control signal, are provided from the control circuit board 110 to the phase-locked loop module 334.

FIG. 3B is a schematic block diagram of a transmitter array 300 of the transmitter 100 shown in FIG. 3A, in accordance with some embodiments. In some embodiments, the transmitter array 300 includes another power divider network 346 and a plurality of transmitter blocks 310. In some embodiments, the power divider network 346 forms a combined power divider network with the power divider network 342, in which the power dividers 344 in the final stage K N of the power divider network 346 is connected to a corresponding transmitter block 310. In some embodiments, the power divider network 346 includes N-2 stages, and each power divider 344 in each stage is configured to distribute power of the RF signal RF_in at the input terminal substantially equally to the two output terminals of the power divider 344. In some embodiments, the supply voltage VD and the control signals Din, CLK, and SYNC are also provided to each of the transmitter blocks 310 through a bus or a plurality of signal lines.

FIG. 3C is a schematic block diagram of the transmitter block 310 of the transmitter array 300 shown in FIG. 3B, in accordance with some embodiments. In some embodiments, the transmitter block 310 is formed of a row of RF chips 208 and a row of antenna feed lines 212 corresponding to the row of RF chips 208. In some embodiments, as discussed earlier with reference to FIG. 2B, the RF chips 208 each include individual RF circuitries, and also referred to as RF circuits 208. In some embodiments, the RF chips 208 are configured as transmitter (TX) RF chips. In some embodiments, the supply voltage VD is provided and transmitted to each of the RF chips 208. Further, the control signals, including the calibration data Din, the data clock signal CLK and the synchronization clock signal SYNC, are fed into each RF chip 208 through one or more signal lines. In some embodiments, the RF signal RF_in is also fed into each RF chip 208 through the transmission line 220. Referring to FIGS. 2B and 3C, in some embodiments, the RF signal RF_in is transmitted to the antenna patches 206 through the transmission line 220, the RF chips 208 (output as RF signals RF_out), the feed lines 212 and the substrate 202, and radiated outward by the antenna patches 206.

The RF chip 208 is configured to generate calibrated RF signals as an RF output signal RF_out after calibration of the RF signal RF_in according to the calibration data Din is performed. In some embodiments, the update rate of calibration is controlled by the data clock signal CLK and the synchronization clock signal SYNC. In some embodiments, the RF chip 208 includes input ports for the respective RF signal RF_in, the supply voltage VD, the calibration data Din, the data clock signal CLK and the synchronization clock signal SYNC. In some embodiments, the RF chip 208 includes output ports for the respective calibration data Dout and two branches of the RF output signal RF_out, i.e., the RF component signals RF_out_I and RF_out_Q.

In some embodiments, the RF output signal RF_out is formed of the in-phase component RF_out_I and the quadrature component RF_out_Q corresponding to the horizontal (H)-polarization and vertical (V)-polarization components, respectively. The separate components RF_out_I and RF_out_Q represent the in-phase component RF_out_I and the quadrature component RF_out_Q, and they are in quadrature with each other. The separate quadrature components of the RF output signal may aid in calibration of the RF signal RF_in or the RF output signal RF_out.

In some embodiments, the data clock signal CLK and the synchronization clock signal SYNC are fed to the input ports for the data clock signal CLK and the synchronization clock signal SYNC, respectively, of each of the RF chips 208. In some embodiments, the calibration data Din is transmitted to the first (leftmost) RF chip 208 from the input port of the calibration data Din through a signal line, and the first RF chip 208 relays the calibration data Din to a second RF chip 208 adjacent to the first RF chip 208 from an output port Dout of the first RF chip 208 and through another signal line. Subsequently, the calibration data Din is transmitted to the input port Din of the calibration data Din in the third RF chip 208. As a result, the calibration data Din is transmitted via the input ports and the output ports of the cascaded RF chips 208 until the last (rightmost) RF chip 208. The data read timing may be controlled by the data clock signal CLK and the synchronization signal SYNC.

In some embodiments, transmitter block 310 include a transmission line 220 between the first end, i.e., the input port of the transmitter block 310, and a second end of the transmission line 220. In some embodiments, the second end of the transmission line 220 is connected to ground through a resistive load 372. In some embodiments, the transmission line 220 is a straight line or a line including multiple line segments extending in different directions. In some embodiments, the transmission line 220 is parallel to the row of the RF chips 208. The resistive load 372 may include a resistor. In some embodiments, the resistance of the resistive load 372 is determined to match the impedance of the transmission line 220 in order to eliminate signal reflection. In some embodiments, the resistive load 372 includes a resistance of about 50 ohms.

In some embodiments, the RF signal RF_in is propagated from the first end to the second end of the transmission line 220. In some embodiments, in a phased array antenna configuration, the adjacent antenna feed lines 212 are spaced apart by a predetermined antenna spacing. The antenna spacing may be related to the wavelength of the RF signal RF_in. Furthermore, the RF output signals RF_out_I and RF_out_Q transmitted by the individual antenna feed lines 212 should be modulated with proper phase delays according to the phase adjustment data in the calibration data Din to collectively construct a directional RF signal beam. Therefore, each of the RF output components signals RF_out_I and RF_out_Q are phase modulated according to one or more design criteria, such as their locations in the antenna array.

In some embodiments, the RF chips 208 may not be arbitrarily arranged on the interconnect structure 204. In some embodiments, the row of RF chips 208 in the same transmitter block 310 are connected to connecting terminals of the transmission line 220 at different locations Di of the transmission line 220, where the index i represents the i-th RF chip 208 in the transmitter block 310, and $1<i<=L$, where L can be any integer greater than 1. In some embodiments, the number L is in a range between two and eight. The locations Di are spaced apart by a predetermined distance. In some embodiments, the RF chips 208 are equally distributed between the first end and the second end of the transmission line 220. The signal feeding type of RF chips 208 in the transmitter block 310 using the single transmission line 220 is referred to as a "series-feed" signal feeding method. The RF signal RF_in may have phase differences among the different locations D1, D2, . . . D7, . . . DL of the transmission line 220. The undesired phase delays caused by the different locations D1 through DL may be addressed and compensated for by the phase adjustment data of the calibration data Din at the same time. As a result, the issue of phase inaccuracy in the phased array antenna can be resolved without paying additional cost.

The in-phase RF signal RF_out_I and the quadrature RF signal RF_out_Q are coupled to the antenna patch 206, combined and radiated outwardly through the antenna patch 206. The combined RF signal RF_out based on the in-phase RF signal RF_out_I and the quadrature RF signal RF_out_Q results in a circularly polarized RF signal RF_out. In some embodiments, the combined RF signal RF_out is a right-hand circularly polarized RF signal or a left-hand circularly polarized signal dependent upon the order of phases of the in-phase RF signal RF_out_I with respect to the quadrature RF signal RF_out_Q. In some embodiments, since the ideal circular polarization of the RF signal output RF_out is achieved with the equal amplitudes and the accurate phase difference of 90 degrees between the in-phase RF signal RF_out_I and the quadrature RF signal RF_out_Q, the effectiveness of the calibration data Din plays an important role. In some embodiments, the in-phase RF signal RF_out_I and the quadrature RF signal RF_out_Q are split before they are transmitted to the antenna patch 206 and subjected to the amplitude calibration and phase calibration independently. Further, in some embodiments, the in-phase RF signal RF_out_I and the quadrature RF signal RF_out_Q are received from the antenna patch 206 and subjected to the amplitude calibration and phase calibration independently in the RF chip 208 before they are combined and transmitted out of the RF chip 208. Therefore, the calibration task can be achieved easily without complicated calibration circuitry.

In some embodiments, the RF chip 208 is designed to include an input terminal or input port with high-impedance. For example, the input impedance Rin of the RF chip 208 viewed from the transmission line 220 into the RF chip 208 through an input terminal 208A or input port of the RF chip 208 is relatively high, e.g., greater than about 100K ohms, greater than 500K ohms, or greater than 1000K ohms.

Figure 3D:
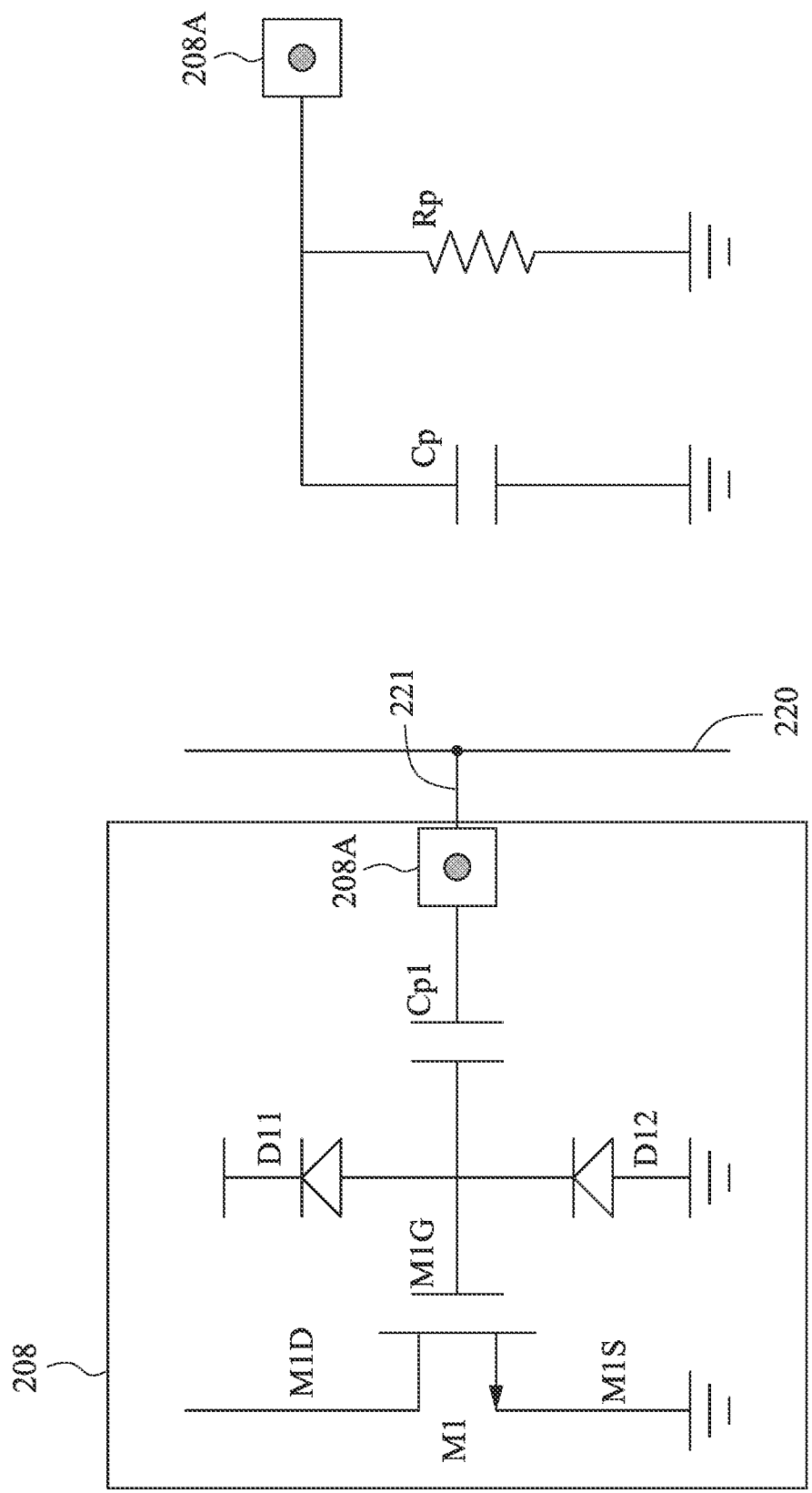
FIG. 3D shows schematic block diagrams of an RF chip shown in FIG. 3C and an equivalent circuit of an input of the RF chip, in accordance with some embodiments.

FIG. 3D shows in a left subfigure a schematic block diagram of an RF chip 208 shown in FIG. 3C, in accordance with some embodiments. In some embodiments, the input port 208A of the RF chip 208 is connected to a field-effect transistor (FET) M1, e.g., metal-oxide-semiconductor FET (MOSFET), in which a gate terminal M1G or gate electrode is connected to the transmission line 220 through a branch transmission line 221. In some embodiments, the MOSFET M1 is connected to the input port 208A of the RF chip 208 through a capacitor Cp1. In some embodiments, the capacitor Cp1 is connected to diodes D11 and D12 of the RF chip 208 at the gate terminal M1G. Referring to a right subfigure of FIG. 3D, the circuits of the RF chip 208 connected to the input port 208A shown in the left subfigure can be represented by an equivalent circuit formed of the capacitor Cp in parallel connection with an input resistance Rp. In some embodiments, the input resistance Rp (or Rin) or the input impedance of the RF chip 208 through looking into the gate terminal M1G of the RF chip 208 is substantially equal to or greater than ten times an impedance through looking into the transmission line 220 from the input terminal 208A connected to the transmission line 220, e.g., equal to or greater than about 500 ohm, In some embodiments, the input resistance Rp, equal to the input resistance Rin shown in FIG. 3C, is at least equal to or greater than 500 ohm, 1000 ohm, or 5000 ohm. In some embodiments, to maintain the high-impedance property of the input port 208A of the RF chip 208, the MOSFET arranged at the input port 208A of the RF chip 208 is not connected to other circuitry of the RF chip 208 in parallel. In some embodiments, there is no any intermediate circuit, matching network or buffering circuit between the branch line 221 and the gate terminal M1G of the RF chip 208. In some embodiments, the abovementioned series-feed type signal feeding type of the RF signal RF_in is accomplished through a voltage-driven signal feeding type. The RF output signal RF_out is generated based on a voltage signal transmitted at the gate terminal M1G of the input MOSFET M1, rather than a current-driven signal.

Based on the foregoing, the proposed series-type signal feeding method provides advantages. The current level flowing into the input port 208A of the RF chip 208 is very low due to the high-impedance nature of the MOSFET if leakage current can be managed well. Therefore, the power consumption of the RF chip 208 would be relatively low without compromising the device performance. Moreover, an additional phase calibration module for the transmitter block 310 is not necessary since the calibration data in the control signal already include phase calibration data in a phased array antenna architecture to aid in calibration of the RF signal RF_in, in which the adjustment of the delayed phases also covers phase adjustment or calibration.

Existing RF chip adopts transmission of the RF signals with a current-driven signal feeding type, which comes with a tree-type power divider network. Each of the power divider at the final stage of the tree-type power divider network is connected to a corresponding RF chip. The input port is design to comply with the impedance matching rule, e.g., including an impedance of about 50 ohms. Driving currents flow from the RF signal source into each of the RF chips through the tree-type power divider network. Such RF signal feeding architecture consumes power when the RF signal is being distributed to the RF chips at the endpoint of the power divider network. Although the phase errors among the RF chips of the current-driven signal feeding type may be less than the voltage-driven signal feeding type due to its substantially equal transmission lengths for all the RF chips with respect to the RF signal source, the process-induced device variations still often lead to unneglectable phase differences. Therefore, the phase calibration module is usually necessary to ensure the performance of the phased array antennas. In contrast, the proposed voltage-driven signaling type consumes less power and requires a lower number of the power dividers without compromising the device performance. The power, cost and reliability of the transmitter can thus be improved through the proposed antenna array structure.

In some embodiments, the series-feed type signal feeding type of the present disclosure further aids in the routing efficiency. Referring to FIGS. 3A, 3B and 3C, the transmitter arrays 300 (including RF chips 208) are arranged in a column direction in the central portion of the RF circuit board 120, while the peripheral circuits, e.g., the power divider networks 342 and 346, the amplifiers 335, 338 and the mixer 336 are arranged on two sides of the RF circuit board 120. The one-dimensional arrangement of the transmitter block 310 extends in the row direction, in which the antenna spacing and the number of the RF chips determine the length/width ratio of the transmitter block 310. Taking the stage number N=5 and the RF chip number L=8 in the transmitter block 310 as an example, the resulting transmitter array of the transmitter 100 formed of the transmitter arrays 300 would be of the size of 32×32 RF chips 208, which is in a square shape. Further, in performing the routing of the power and signal transmission lines, e.g., supply voltage VD, the control signals Din, CLK, SYNC, and the RF signal RF_in of the transmitter blocks 310, the percentage of wiring crossing is relatively low due to its row shape. As a result, a square phased antenna array can be implemented with high routing efficiency. Furthermore, the phase array antenna of the present disclosure can be scaled up or scaled down in a straightforward manner by simply adjusting the numbers N and L without the need of re-engineering the placing and routing.

Figure 4A:
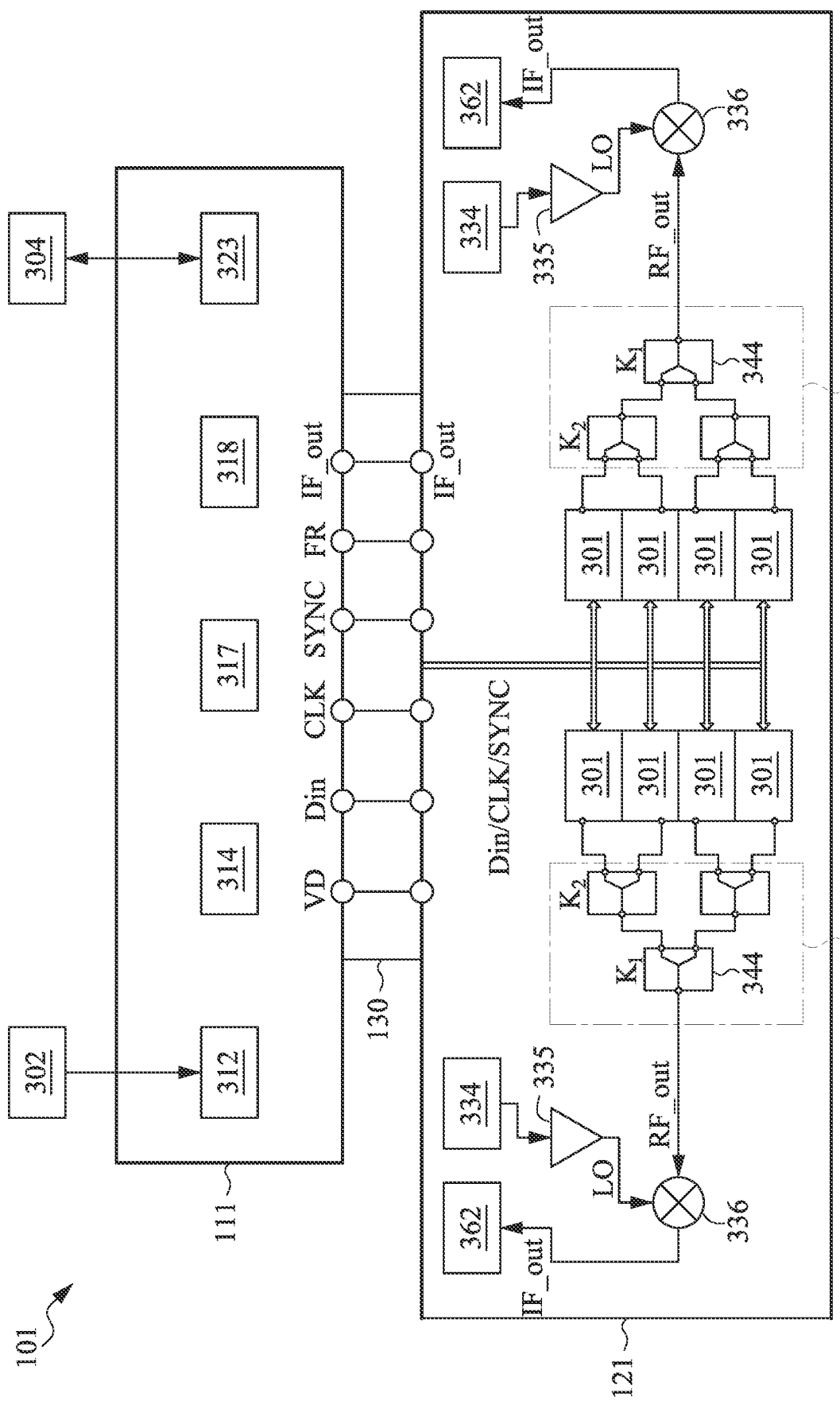
FIG. 4A is a schematic block diagram of a receiver, in accordance with some embodiments.

FIG. 4A is a schematic block diagram of a receiver 101, in accordance with some embodiments. In some embodiments, the receiver 101 is an RF receiver. In some embodiments, the receiver 101 is seen as a reciprocal device of the transmitter 100, in which the receiver 101 also includes the control circuit board 111, the RF circuit board 121 and the connection circuit board 130 connecting the control circuit board 111 to the RF circuit board 121. The receiver 101 may be different from the transmitter 100 in the operation frequency to facilitate duplex transmission, e.g., one of the transmitter 100 and receiver 101 is configured to operate at a frequency of 18 GHz, while the other is configured to operate at a frequency of 28 GHz. The device design parameters for the transmitter 100 and receiver 101 may be different due to the different operating frequencies. In some embodiments, the receiver 101 is applicable to the user devices 12, 14, 16, 18, the terrestrial base station 22 or the non-terrestrial base station 24.

In some embodiments, the control circuit board 111 includes a power conversion module 312, a memory module 314, a controller 317, a local oscillator module 318 and a data processing module 323. In some embodiments, additional modules may be added to the control circuit board 111, or some of the abovementioned modules can be omitted or replaced by another module. The functions and configurations of the connection circuit board 130, the power conversion module 312, the memory module 314 and the local oscillator module 318 are similar to those described with reference to FIG. 3A, and thus the details are not repeated herein for brevity.

In some embodiments, the controller 317 is configured to control the demodulation of the receiver signal. In some embodiments, the receiver signal generated by the control circuit board 111 takes an IF input signal form as IF_out, which will be down-converted to a baseband signal by the controller 317 or the data processing module 323. In some embodiments, the controller 317 is powered by an external power source or the power conversion module 312 and receives the IF signals IF_out according to the receiver data IF_out provided by the RF circuit board 121. In some embodiments, the controller 317 is configured to generate control signals for the phase array antenna, such as the calibration data Din, the data clock signal CLK, and the synchronization clock signal SYNC.

In some embodiments, the data processing module 323 shown in FIG. 4A is configured to receive commands from a control unit 304 external to the control circuit board 110. The data processing module 323 or the controller 317 may be configured to receive transmission data extracted from the received IF signals IF_out provided by the RF circuit board 121, and transmit the transmission data to the control unit 304.

The RF circuit board 121 includes a pair of RF signal reception paths, a pair of power combiner networks 352, and two columns of receiver arrays 301. Each of the RF signal reception paths shown in FIG. 4A proceeds in a manner reciprocal to the RF signal generation paths shown in FIG. 3A. In some embodiments, the left-side column of the receiver arrays 301 and the right-side column of receiver arrays 301 are symmetrically arranged about a central line between the left-side column and right-side column of the receiver arrays 301. In some embodiments, the left-side power combiner network 352 and the right-side power combiner network 352 are symmetrically arranged about a central line between the left-side and right-side power combiner networks 352. In some embodiments, each RF signal reception path includes an IF signal receiver 362, a phase-locked loop module 334, amplifiers 335 and 338, and a mixer 336. In some embodiments, the IF signal receiver 332 is configured to receive the IF signals IF_out from the output of the mixer 336. The phase-locked loop module 334 may be configured to generate a local oscillator signal LO based on the reference frequency FR through a phase-locking procedure. In some embodiments, the local oscillator signal LO is amplified via the amplifier 335. In some embodiments, the amplifier 335 is an operational amplifier. The mixer 336 is configured to down-convert the RF signals RF_out to the IF signal IF_out at a predetermined frequency band, e.g., 445 kHz. In some embodiments, the RF signal RF_out is amplified via an amplifier, e.g., an operational amplifier.

In some embodiments, the power combiner network 352 is connected to the input of the mixer 336 and configured to collect the RF signal RF_out from each RF chip 208 (see FIG. 4C) into a combined RF data signal RF_out. The power combiner network 352 shown in FIG. 4A is a multistage power combiner network similar to the power divider 342 shown in FIG. 3A, except that the input terminals and output terminals are reversed. In some embodiments, the control signals, including the calibration data Din, the data clock signal CLK and the synchronization clock signal SYNC, are provided to each of the receiver arrays 301 through a bus or a plurality of signal lines.

Figure 4B:
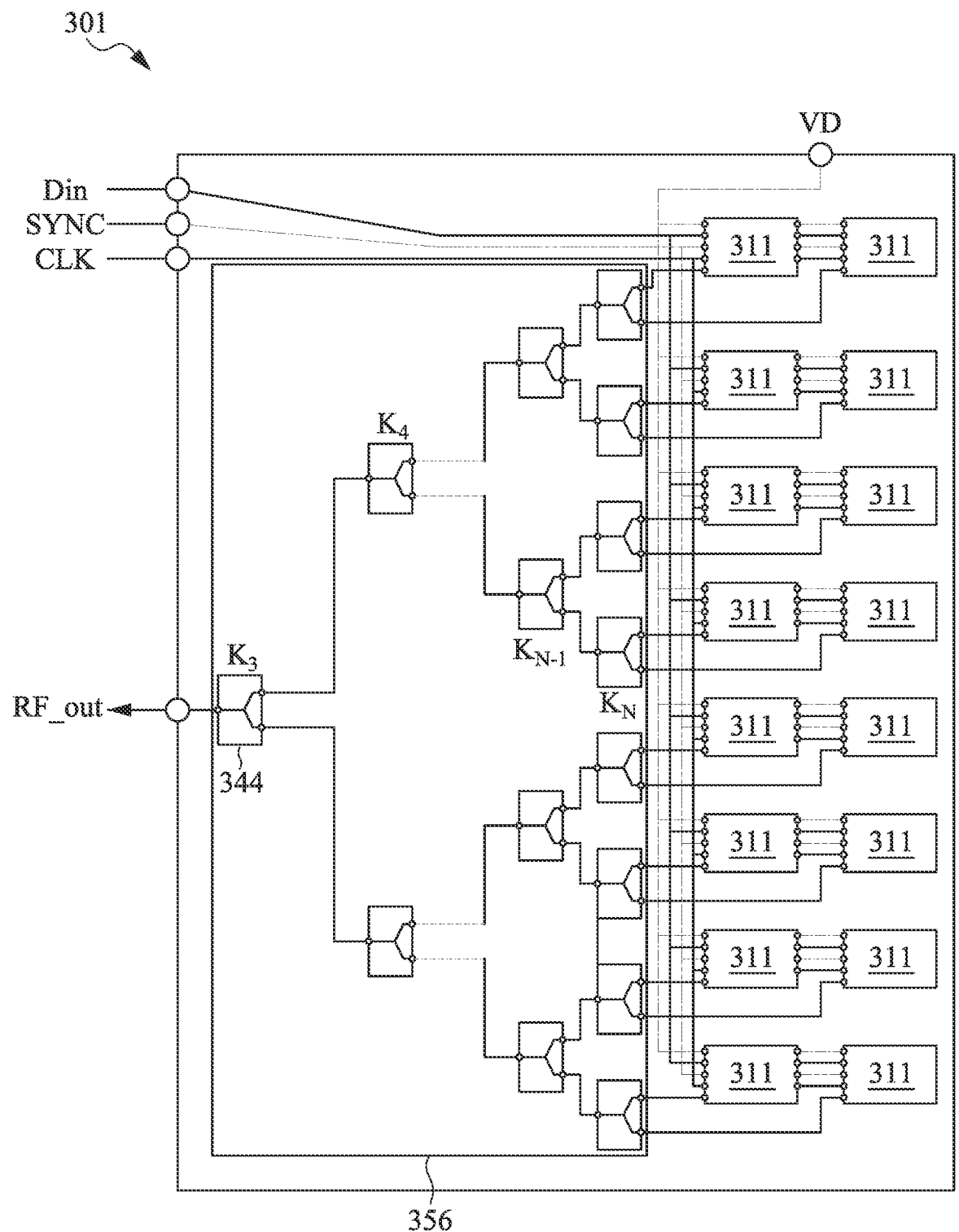
FIG. 4B is a schematic block diagram of a receiver array of the receiver shown in FIG. 4A, in accordance with some embodiments.

FIG. 4B is a schematic block diagram of a receiver array 301 of the receiver 101 shown in FIG. 4A, in accordance with some embodiments. In some embodiments, the receiver array 301 includes another power combiner network 356 and a plurality of receiver blocks 311. In some embodiments, the power combiner network 356 shown in FIG. 4B is similar to the power divider network 346 shown in FIG. 3B, except that the input terminals and the output terminals are reversed. In some embodiments, the supply voltage VD and the control signals, including the calibration data Din, the data clock signal CLK and the synchronization clock signal SYNC, are also provided to each of the receiver blocks 311 through a bus or a plurality of signal lines.

Figure 4C:
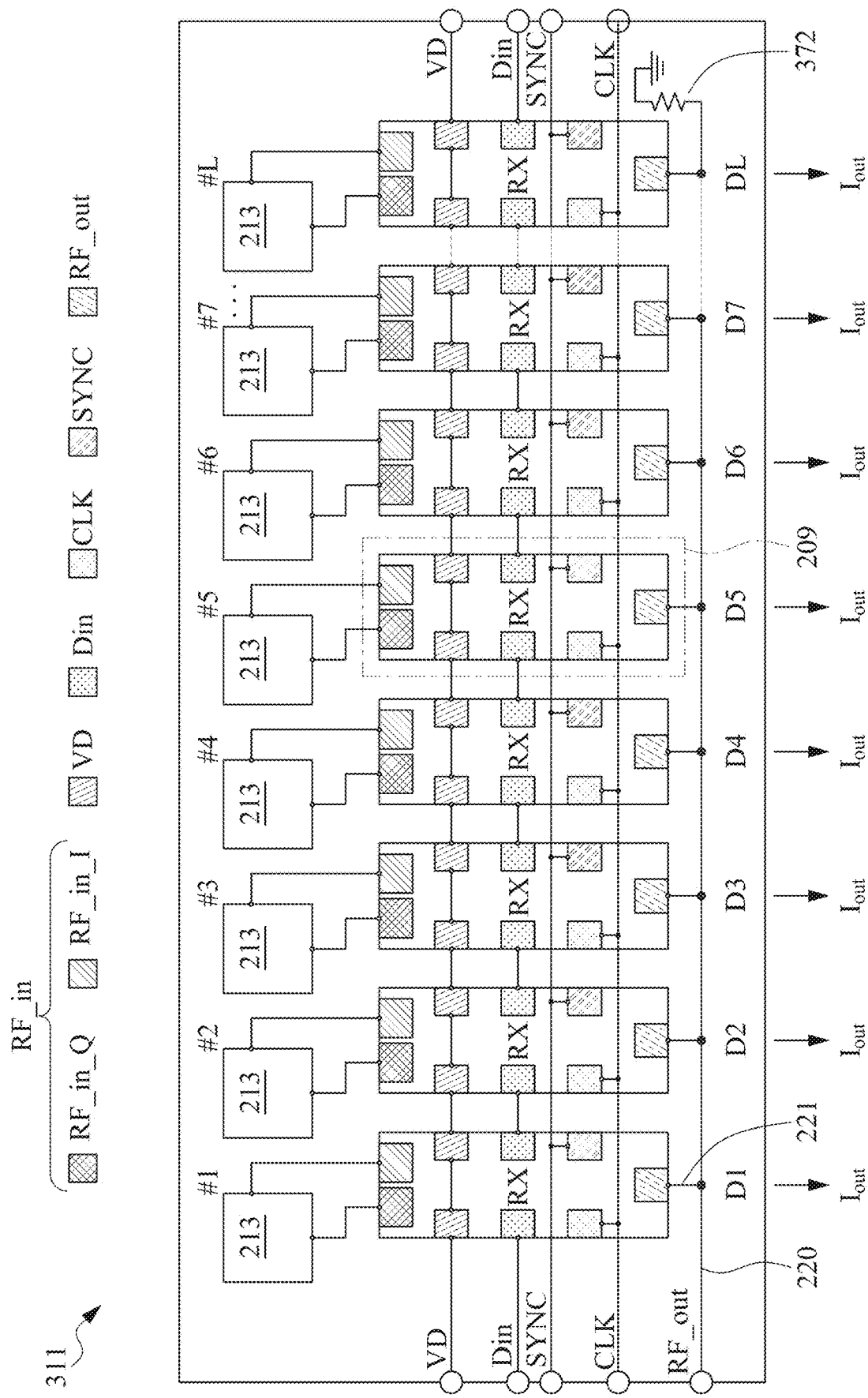
FIG. 4C is a schematic block diagram of a receiver block of the receiver array shown in FIG. 4B, in accordance with some embodiments.

FIG. 4C is a schematic block diagram of a receiver block 311 of the receiver array 301 shown in FIG. 4B, in accordance with some embodiments. In some embodiments, the receiver block 311 is formed of a row of RF chips 209 and a row of antenna feed lines 213 corresponding to the row of RF chips 209. In some embodiments, as discussed earlier with reference to FIG. 2B, the RF chips 209 each include individual RF circuitries, and also referred to as RF circuits 209. In some embodiments, the RF chips 209 are configured as receiver (RX) RF chips. In some embodiments, the supply voltage VD is provided and transmitted to each of the RF chips 209. Further, the control signals, including the calibration data Din, the data clock signal CLK and the synchronization clock signal SYNC, are fed into each RF chip 209. Referring to FIGS. 2B and 4C, in some embodiments, the RF signal RF_in is received by the antenna patches 206, and transmitted to the signal port RF_in through the substrate 202, the feed lines 213, the RF chips 209 (output as the RF signals RF_out), and the transmission line 220.

The RF chip 209 is configured to provide a calibrated RF signal RF_out from an RF input signal RF_in on the antenna feed lines 213 according to the calibration data Din. In some embodiments, the update rate of calibration is controlled by the data clock signal CLK and the synchronization clock signal SYNC. In some embodiments, the RF chip 209 includes input ports for the respective the in-phase RF signal component RF_in_I and the quadrature RF signal component RF_in_Q, the supply voltage VD, the calibration data Din, the data clock signal CLK and the synchronization clock signal SYNC. In some embodiments, the RF chip 209 includes output ports Dout for the respective calibration data and the RF signals RF_out. The functions and configurations of the calibration data Din, the data clock signal CLK and the synchronization clock signal SYNC are similar to those described with reference to FIGS. 3A to 3C, and details are not repeated herein.

In some embodiments, receiver block 311 include a transmission line 220 between the first end, i.e., the output port of the receiver block 311, and a second end of the transmission line 220. In some embodiments, the second end of the transmission line 220 is connected to ground through a resistive load 372. In some embodiments, the transmission line 220 is a straight line or a line including multiple line segments extending in different directions. In some embodiments, the transmission line 220 is parallel to the row of RF chips 209. The resistive load 372 may include a resistor. In some embodiments, the resistance of the resistive load 372 is determined to match the impedance of the transmission line 220 in order to eliminate signal reflection. In some embodiments, the resistive load 372 includes a resistance of about 50 ohm.

In some embodiments, the provided RF signals RF_out are propagated between the first end and the second end of the transmission line 220. The RF signals provided by the individual antenna feed lines 213 should be demodulated with proper phase delays according to the phase adjustment data in the calibration data Din to collectively form an accumulated constructive RF signal RF_out. Therefore, before the RF signal components RF_in_I and RF_in_Q are combined or before the individual RF signals RF_out is fed to the transmission line 220, they are phase demodulated according to one or more design criteria, such as their locations in the antenna array. In some embodiments, each of the RF signals RF_out is a current signal $I_{out}$ fed to the corresponding connecting terminals at different locations Di on the transmission line 220 from the corresponding RF chip 209.

In some embodiments, the RF chip 209 is designed to include an output terminal with impedance matching to the transmission line 220 for maximizing the current $I_{out}$ of the RF signal RF_out. For example, the output impedance of the RF chip 209 is about 50 ohms.

Referring to FIGS. 4A and 4B, the collected and combined RF signal RF_out is transmitted through the power combiner networks 356 and 352 to reach the mixer 336 for performing down-conversion to the IF signal IF_out. The phase-locked loop module 334 may be configured to generate a local oscillator signal LO based on the reference frequency FR through a phase-locking procedure. In some embodiments, the IF signal receiver 362 is configured to receive the IF data signals IF_in from output of the mixer 336. In some embodiments, the local oscillator signal LO is amplified via the amplifier 335. In some embodiments, the amplifier 335 is an operational amplifier. The IF signal IF_out is transmitted to the control circuit board 110 through the IF signal receiver 362 and the connection circuit board 130. In some embodiments, the IF signal IF_out is down-converted to the baseband signal by the controller 317 or the data processing module 323, and the transmission data modulated in the RF signal RF_out is demodulated and detected from the baseband signal.

Figure 4D:
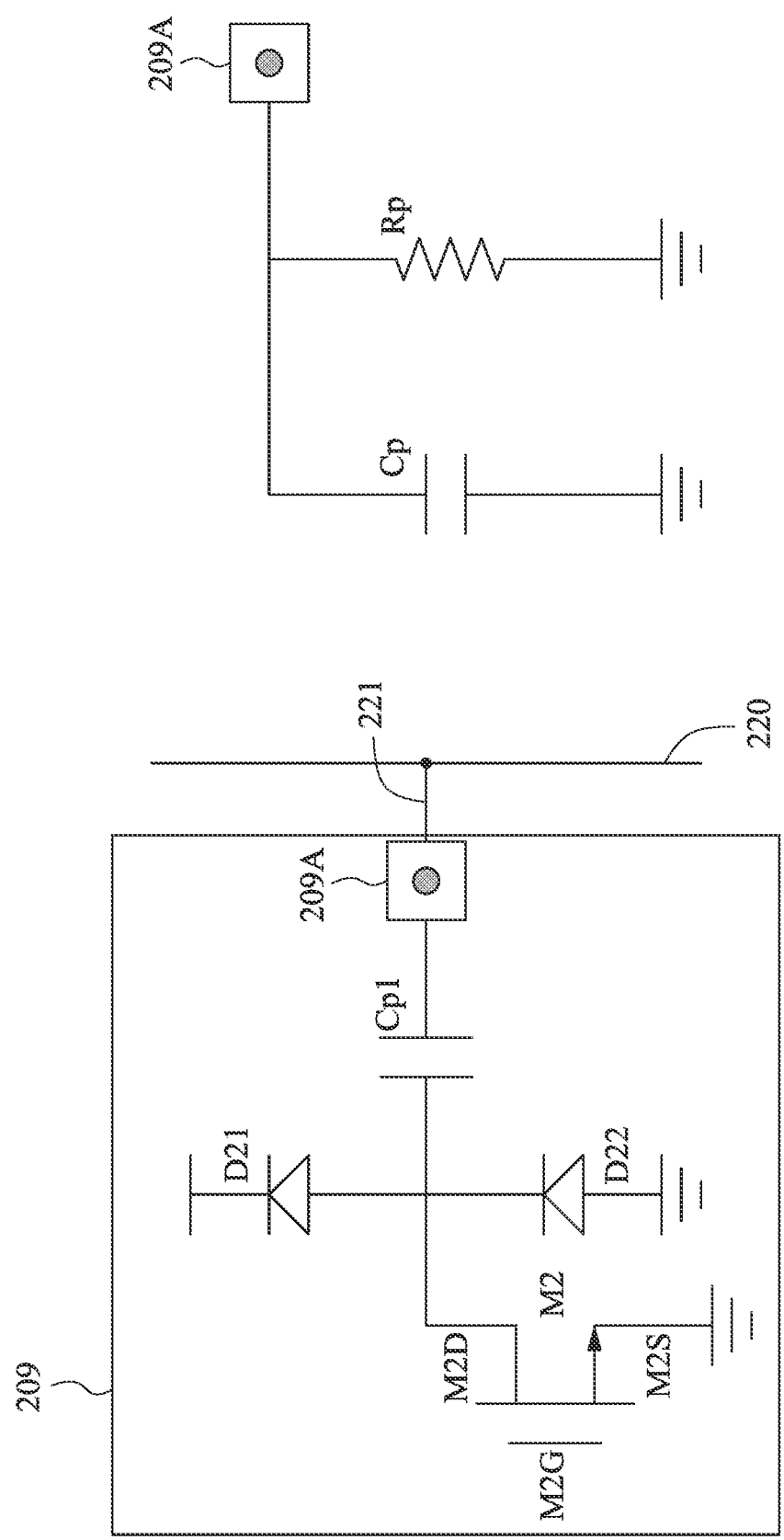
FIG. 4D shows schematic block diagrams of an RF chip shown in FIG. 4C and an equivalent circuit of an input of the RF chip, in accordance with some embodiments.

FIG. 4D shows schematic block diagrams of an RF chip 209 shown in FIG. 4C and an equivalent circuit of an output of the RF chip 209, in accordance with some embodiments. FIG. 4D shows in a left subfigure a schematic block diagram of an RF chip 209 shown in FIG. 4C, in accordance with some embodiments. In some embodiments, an output terminal 209A or output port of the RF chip 209 is formed of a FET M2, in which a drain terminal D2 is connected to the transmission line 220 through a branch transmission line 221. In some embodiments, the output port 209A of the RF chip 209 is designed to include a relatively high input impedance to ensure the majority of the output current $I_{out}$ of the received RF signal RF_out provided from one RF chip 209 to the transmission line 220 would not flow back to other RF chips 209 of the same receiver block 311.

In some embodiments, the MOSFET M2 is connected to the output port 209A of the RF chip 209 through a capacitor Cp1. In some embodiments, the capacitor Cp1 is connected to diodes D21 and D22 of the RF chip 209 at the drain terminal M2D. Referring to a right subfigure of FIG. 4D, the circuits of the RF chip 209 connected to the input port 209A shown in the left subfigure can be represented by an equivalent circuit formed of the capacitator Cp in parallel connection with an input resistance Rp. In some embodiments, the input impedance or resistance Rp of the RF chip 209 through looking into the drain terminal M2D of the RF chip 209 is substantially equal to or greater than ten times the input impedance looking into the transmission line 220 from the output terminal 209A connected to the transmission line 220. In some embodiments, the input resistance Rp of the RF chip 209 is at least equal to or greater than 500 ohm, 1000 ohm, or 5000 ohm.

Based on the foregoing, the proposed series-type signal accumulating method provides advantages. The current level flowing from one RF chip 209 to other RF chips 209 in the same receiver block 311 is very low due to the high-impedance nature of the MOSFET if leakage current can be managed well. Therefore, the power collection efficiency of the RF chip 209 would be relatively high without compromising the device performance. Moreover, an additional phase calibration module for the receiver block 311 is not necessary since the calibration data in the control signal already include phase calibration data in a phased array antenna architecture to aid in calibration of the RF signal RF_in (including the in-phase RF signal component RF_in_I and the quadrature RF signal component RF_in_Q), in which the adjustment of the delayed phases also covers phase adjustment or calibration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wireless communication system, comprising:
   a plurality of antennas;
   a plurality of RF chips, arranged in a row and coupled to the antennas, for providing a plurality of radio-frequency (RF) output signals to the antennas according to an RF signal;
   a transmission line, arranged to be a straight line in parallel to the row, and to connect to the RF chips; and
   a resistive load, coupled to a first end of the transmission line,
   wherein a second end of the transmission line is arranged to receive the RF signal,
   wherein each of the RF chips comprises a transistor having a gate terminal serving as an input terminal connected to the transmission line,
   wherein a first impedance looking into the gate terminal of a corresponding RF chip is ten times greater than a second impedance looking into the transmission line from a corresponding input terminal connected to the transmission line.

2. The wireless communication system of claim 1, wherein the RF chips are arranged to be equally distributed between the first end and the second end to connect to the transmission line.

3. The wireless communication system of claim 1, wherein each of the RF chips is arranged to receive the RF signal by coupling a voltage signal on a corresponding connecting terminal of the transmission line.

4. The wireless communication system of claim 1, wherein each of the RF chips includes a first diode and a second diode connected to the input terminal in parallel connection.

5. The wireless communication system of claim 4, further comprising:
   a plurality of branch transmission lines, each branch transmission line coupled between the gate terminal of a corresponding RF chip and the transmission line.

6. The wireless communication system of claim 4, wherein the first diode and the second diode are arranged in a reverse biasing configuration.

7. The wireless communication system of claim 1, further comprising:
   a substrate, having a first surface and a second surface opposite the first surface,
   wherein the antennas are disposed on the first surface, and the plurality of RF chips and the transmission line are disposed over the second surface.

8. The wireless communication system of claim 7, wherein the substrate is transparent.

9. The wireless communication system of claim 7, wherein the substrate is formed of glass, fused silica, or quartz.

10. The wireless communication system of claim 7, wherein the RF chips are configured to couple the RF signal to the antennas through the substrate, wherein the substrate is free of any conductive elements between the RF chips and the antennas.

11. The wireless communication system of claim 1, further comprising a plurality of signal lines connected to the RF chips and configured to provide calibration data for the RF signal.

12. The wireless communication system of claim 11, wherein the calibration data includes at least one of amplitude calibration data and phase calibration data.

13. The wireless communication system of claim 12, wherein the phase calibration data provides phase delays of each of the RF chips for a phased array antenna scheme of the antennas.

14. A wireless communication system, comprising:
a plurality of antennas;
a plurality of RF chips, arranged in a row and coupled to the antennas, for receiving a plurality of radio-frequency (RF) signals from the antennas to output a plurality of RF output signals;
a transmission line, arranged to be a straight line in parallel to the row, and to connect to the RF chips for receiving the RF output signals; and
a resistive load, coupled to a first end of the transmission line,
wherein a second end of the transmission line is arranged to output an accumulated RF output signal of the RF output signals,
wherein each of the RF chips comprises a transistor having a drain terminal connected to the transmission line through an output terminal of each of the RF chips,
wherein a first impedance looking into the drain terminal of a corresponding RF chip is ten times greater than a second impedance looking into the transmission line from a corresponding output terminal connected to the transmission line.

15. The wireless communication system of claim 14, wherein the RF chips are arranged to be equally distributed between the first end and the second end to connect to the transmission line.

16. The wireless communication system of claim 14, wherein each of the RF output signals is a current signal fed to a corresponding connecting terminal on the transmission line from a corresponding RF chip.

17. The wireless communication system of claim 14, wherein each of the RF chips includes a first diode and a second diode connected to the output terminal in parallel connection.

18. The wireless communication system of claim 17, further comprising:
a plurality of branch transmission lines, each branch transmission line coupled between the drain terminal of a corresponding RF chip and the transmission line.

19. The wireless communication system of claim 17, wherein the first diode and the second diode are arranged in a reverse biasing configuration.

20. The wireless communication system of claim 14, further comprising:
a substrate, having a first surface and a second surface opposite the first surface,
wherein the antennas are disposed on the first surface, and the plurality of RF chips and the transmission line are disposed over the second surface.

* * * * *